United States Patent [19]

Gallagher et al.

[11] Patent Number: 4,831,421

[45] Date of Patent: May 16, 1989

[54] SUPERCONDUCTING DEVICE

[75] Inventors: William J. Gallagher, Ardsley; Stanley I. Raider, Briarcliff Manor, both of N.Y.

[73] Assignee: International Business Machines Corporation, Armonk, N.Y.

[21] Appl. No.: 213,447

[22] Filed: Jun. 28, 1988

Related U.S. Application Data

[63] Continuation of Ser. No. 786,788, Oct. 11, 1985, abandoned.

[51] Int. Cl.$^4$ ................. H01L 39/22; H01L 27/22; H01L 49/02
[52] U.S. Cl. ............................. 357/5; 357/4; 357/6
[58] Field of Search .................... 357/4, 5, 6

[56] References Cited

U.S. PATENT DOCUMENTS

| | | | |
|---|---|---|---|
| 3,125,688 | 3/1966 | Rogers | 357/5 |
| 3,689,780 | 9/1972 | Meissner et al. | 307/306 |
| 4,145,699 | 3/1979 | Hu et al. | 357/4 |
| 4,334,158 | 6/1982 | Faris | 307/462 |
| 4,496,131 | 1/1985 | Ohta | 357/5 |
| 4,589,001 | 5/1986 | Sakai et al. | 357/5 |

FOREIGN PATENT DOCUMENTS 60-147179  8/1985  Japan ................. 357/5

OTHER PUBLICATIONS

Physical Review Letters, vol. 37, No. 3, Jul. 19, 1976, p. 150, "Quasiparticle-Injection-Induced Superconducting Weak Links" by Wong et al.
J. Appl. Phys. 51 (3), Mar. 1980, p. 1682, "Simple-Heating-Induced Josephson Effects in Quasiparticle-Injected Superconducting Weak Links" by Kaplan.
JJAP 21, Supplement 21-1, pp. 331-336 (1982), "Quasiparticle-Injected Superconducting Weak Link Device" by Shigeki Sakai et al.
"Nonequilibrium Effects in 1-D Superconductors" by Skocpol, p. 559.
Appl. Phys. Lett. 42(6), Mar. 15, 1983, p. 541, "Fabrication and Josephson Behavior of High-$T_c$ Superconductor-Normal-Superconductor Microbridges" by de Lozanne et al.
Journal of Applied Physics, vol. 45, No. 9, Sep. 1974, p. 4054, "Self-Heating Hotspots in Superconducting Thin-Film Microbridges" by Skocpol et al.
Journal de Physique, 1978, p. C6-1243, "Controllable Proximity-Effect Weak-Links" by Dharmadurai et al.
IEEE Transactions on Magnetics, vol. MAG-17, No. 1, Jan. 1981, p. 573, "Dimensional Effects on Current and Field Properties in NbN Films" by Gavaler et al.

Primary Examiner—Andrew J. James
Assistant Examiner—Ngan Van Ngo
Attorney, Agent, or Firm—Jackson E. Stanland

[57] ABSTRACT

A switch is provided that introduces quasiparticles at an asymmetric location into a reduced cross-sectional area microbridge link that is part of an output path. The quasiparticles nucleate a small region of normal resistivity and the normal region propagates to produce normal resistivity in the entire reduced cross-sectional area microbridge link. The asymmetry of the location provides input-output isolation. The high critical current, high resistivity material for the reduced cross-section member provides high current and voltage gain and the small size provides high speed. In one structure, an input film conductor is asymmetrically, centrally positioned in an insulator stack and a microbridge like is positioned on a beveled side of the stack with the input conductor in tunneling relationship with part of the narrow portion of the microbridge link. Decoupling between input and output sufficient to permit one switch to drive several others is provided. Voltage gain can be sufficient to serve as an interface between superconducting device and semiconductor circuitry.

20 Claims, 6 Drawing Sheets

SUPERCONDUCTING DEVICE

This is a continuation of application Ser. No. 786,788 filed Oct. 11, 1985 now abandoned.

DESCRIPTION

1. Technical Field

The technical field of the invention is in the fabrication of integrated switching devices.

The development of electronic integrated apparatus has been driven by two main desires, the achievement of greater speed and the building of the functions achieved in a smaller size. Semiconductor technology has brought both great speed and very high compactness in integrated circuitry. The superconducting electronics field has long been known as having great speed and compactness potential but manufacture has been difficult.

The semiconductor and superconductor fields have some features in common. As the semiconductor field is developing, the lower temperatures required for superconductivity are also useful in some semiconductor materials for increasing carrier mobility. Thus, a trend is appearing in the art in which advantages in both types of technology are beginning to outweigh items previously considered to be disadvantages and a switching structure that would combine the two technologies would be very useful.

2. Background Art

Heretofore in the art, there have been two cryogenic superconducting injection controlled switches developed that achieved gain through the switching of a large current in response to a smaller signal or control current.

One type is described in Physical Review Letters Vol. 37, No. 3, 1976, p. 150 and J. Appl. Phys. 51 (3), 1682, 1980, where an injected control current is symmetrically introduced into a narrow region between two wider regions constructed to exhibit nonlinear superconducting properties in response to the injected current. This device is known in the superconducting art as a controllable weak link where the injected current drives the link out of superconductivity.

A second illustration of this type of device is the microbridge was described in the Japanese Journal of Applied Physics 21, Supplement 21-1, 331, 1982 This is a structure in which two wide superconducting regions are joined by a narrow superconducting region that exhibits different superconducting threshold response than the wider regions. The structure is controlled by an injection current at high voltage through an opening in an insulator to a silicon substrate. The injection current is into the entire microbridge and the nearby wide regions.

The second type of device is described in U.S. Pat. No. 4,334,158 and is known in the art as the "QUITERON" device which is an acronym, the first four letters of which stand for Quasiparticle Injection Tunnelling. This device is a three-terminal switch in which two superimposed junctions share a common electrode.

DISCLOSURE OF THE INVENTION

The invention employs a switching principle in which a large difference between critical supercurrent and critical quasiparticle injection current occurs together with hot spot nucleation and subsequent propagation. The invention may be considered as operating by injecting a small quasiparticle current into a localized spot in a superconductive thin and narrow cross-sectional area member which causes that spot to become resistive and the heat at that resistive spot in turn causes the entire superconductive small cross-sectional area member to become resistive. The extent of the normal region is confined to the small cross section region by thick and wide contact electrodes.

The switching principle provides voltage gain and decoupling between input and output.

The invention provides these advantages in a variable thickness microbridge link type structure with an asymmetrically positioned input electrode wherein combined horizontal and vertical differentiation manufacturing steps are employed to achieve simplicity.

The advantages and importance of the switching principles and features of the invention can best be understood from the following description in detail of the closer prior art structures.

DESCRIPTION OF THE PREFERRED EMBODIMENTS

In FIGS. 1A, 1B, 1C and 1D, there is shown the structure and operating characteristics of the weak link type structure described in Phys. Rev. Lett. 37, 150 (1976) and in J. Appl. Phys. 51, 1682 (1980).

Figure 1A:
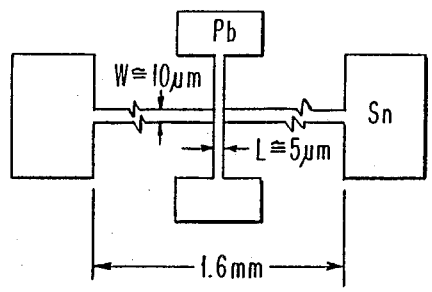
FIGS. 1A, 1B, 1C and 1D, FIG. 2 and FIG. 3 are each illustrations of the three prior art devices.

Referring to FIG. 1A, the quasiparticle; injection weak link configuration is illustrated. In this configuration quasiparticles, which are electronic excitations or phonons that perturb superconductivity are injected from the Pb-5 micrometer line into the Sn-10 micrometer weak link line to drive the Sn line non-superconductive in response to the injected quasiparticle current. The performance is illustrated in the graphs of FIGS. 1B, 1C and 1D.

Figure 1B:
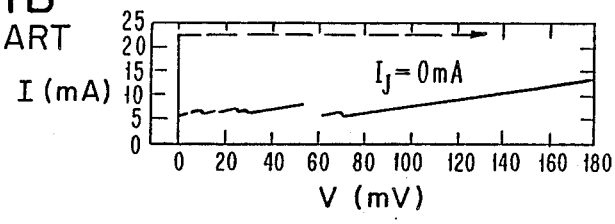

Referring to FIG. 1B, the operating characteristic of the Sn line is shown with no injection from the Pb line. There is a superconductive branch at zero voltage from zero current to a maximum supercurrent of 23 milliamperes, and a resistive branch at non-zero voltages.

Figure 1C:
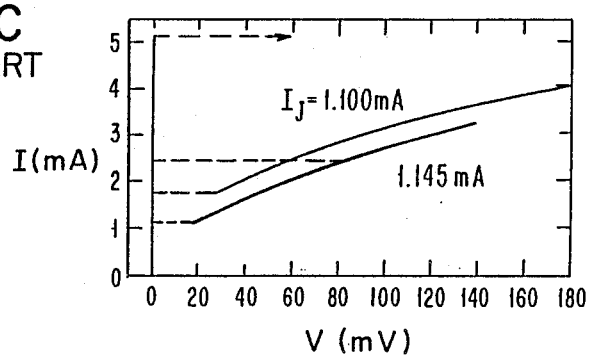

Referring to FIG. 1C, the Sn line operating characteristic with modest injection shows a much reduced maximum supercurrent in the zero voltage branch.

Figure 1D:
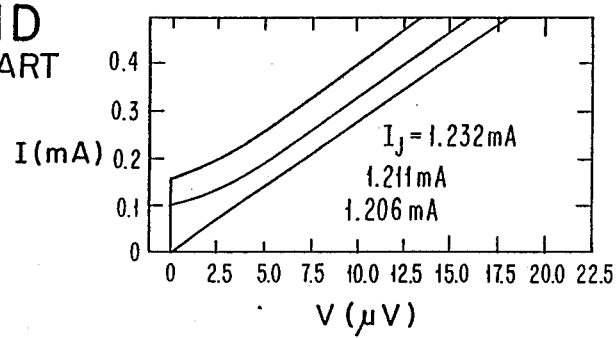

Referring next to FIG. 1D the Sn line characteristic is shown when the injection is just sufficient to drive it into a non-latching superconductive region where there is only a single branch in the characteristic.

The structure of FIG. 1 as may be seen from the operating characteristics employs a quasiparticle current to switch a narrow superconductive wire from superconductivity to resistivity. To develop a large output voltage SN superconductive wire must be long and have a large link driven normal. The growth of the normal region is a slow process, and an IR voltage drop on the normal line results in a strong modification of the control electrode voltage.

Figure 2:
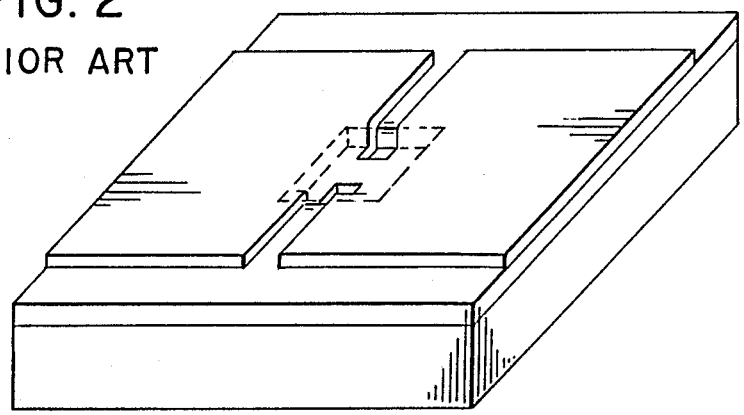

The second example of the first type of prior art structure is that shown in FIG. 2.

Here is depicted a controlled microbridge type of structure as described in the Japanese Journal of Applied Physics 21, Supplement 21-1, 331, 1982. In this structure, a narrow microbridge is formed in a substrate by injection through an opening under superconductor the opening exposing the silicon substrate. An external stimulus, a quasi-particle current introduced through the opening that exposes the substrate, operates to change the superconducting threshold response of the superconductor. This device requires a large input voltage to pass the quasiparticle current from the substrate to the superconductor. The output is in the 1-2 millivolt regime where the superconducting transition phenomena occur. With this device, the high input voltage combined with the high output voltage means there is no voltage gain and in fact there is a substantial voltage loss.

Figure 3:
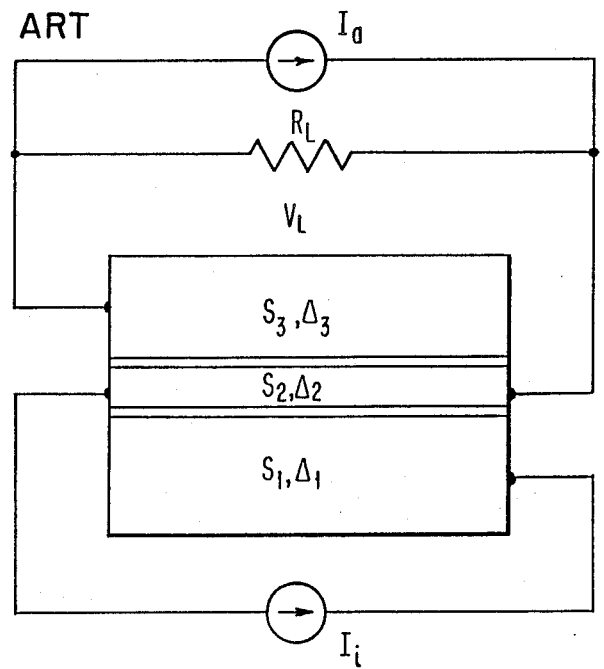

Referring next to FIG. 3, the structure of U.S. Pat. No. 4,334,158 is quite different from the other two in the prior art in that a shared electrode has its performance in one circuit, the output circuit, altered by quasiparticle injection from another circuit, the input circuit. This structure might be considered to be of the "weak link" type of FIG. 1 with the variation that in U.S. Pat. No. 4,334,158 the "weak links" in essence are superimposed junctions. In the structure of U.S. Pat. No. 4,334,158, however, it is the common shared electrode that is driven out of equilibrium and not either of the weak links as in the other prior art.

Referring next to FIGS. 4 through 7, a description of two embodiments of the invention is provided.

Figure 4:
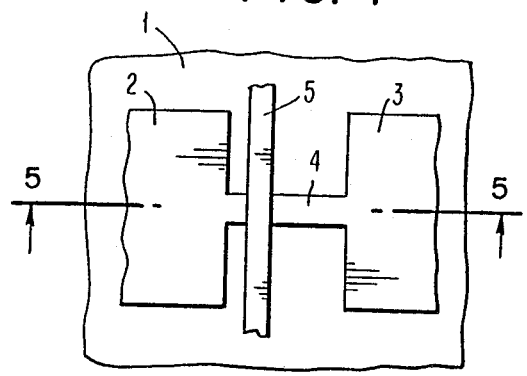
FIG. 4 is a top view of a schematic of one embodiment of the invention.

Referring to FIG. 4, a plan or top view of one embodiment is shown wherein on a substrate 1 there is positioned two large cross-sectional areas 2 and 3, separated by an element 4 of reduced cross-sectional area and special properties. Element 4 performs as a variable thickness microbridge, that is, it exhibits nonlinear superconducting properties in response to injected current and it also is a link or conductor that has the special properties of high critical current density to exhibit superconductivity and high normal resistivity. For one embodiment, the required high critical supercurrent density is greater than 500,000 amps per sq cm to be driven out of the superconductive state. The corresponding high normal state resistivity is of the order of 100 micro ohm centimeters or greater. The element 4 with the special properties in accordance with the invention is described herein as a variable thickness microbridge link which may be referred to hereinafter as a microbridge link. The prior art devices did not employ variable thickness microbridges.

The term microbridge or weak link is often used generically for a weak superconductive connection between two massive superconductive regions, the connection exhibiting Josephson effects. The microbridge links of the present invention are what might properly be called "strong links" and do not generally display Josephson properties, except over a very small range of temperature and electrical bias, and Josephson effects are not involved in-the operation of the present invention.

Asymmetrically positioned across the microbridge link 4 closer to area 2 than to area 3, but insulated from microbridge link 4, is a control electrode 5.

Figure 5:
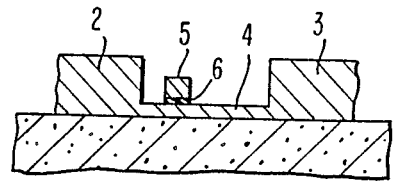
FIG. 5 is a side view taken along the line 5—5 of FIG. 4.

Further details of the structure of FIG. 4 are shown in FIG. 5 which is a side view taken along the line 5—5 of FIG. 4. In FIG. 5, on the substrate 1 between the large cross-sectional regions 2 and 3 there is the reduced cross-sectional element, the microbridge link 4. The control electrode 5 is separated from the microbridge link element 4 by an insulating member 6. The insulator 6 is of the type similar to a Josephson barrier or tunneling barrier member wherein quasiparticle injection occurs above a specific threshold.

In operation a quasiparticle current is injected from control element 5 through insulator 6 into microbridge link 4. The element 4 performs as a "strong link" in that it strongly joins the two broad cross section superconductive regions 2 and 3. Further relevant 4 is small in cross section and exhibits a different superconducting threshold response than the larger cross section regions 2 and 3. Also, microbridge 4 has additional requirements in that of high critical supercurrent density when superconductivity is present and high normal resistivity when the element 4 is resistive. The microbridge link 4, because of its properties, is sensitive to a small quasiparticle current injected control 5 through insulator 6 and becomes resistive at the spot of injection. That spot in turn being resistive becomes heated by what was the supercurrent but has now become normal current. The heating is enhanced by the high normal resistivity special property of element 4, and the spot rapidly propagates and switches the entire microbridge link 4 resistive. The asymmetric positioning of control element 5 with respect to the location of larger areas 2 and 3 provides voltage gain and input-output decoupling. The asymmetry element has not appeared heretofore in the prior art and is essential to obtaining these desirable electrical properties.

Another embodiment of the invention is illustrated in connection with FIGS. 6 and 7 wherein like reference numerals are employed. On a substrate 1, broad cross-sectional regions 2 and 3 are joined by the microbridge link region 4 positioned on the beveled portion of a vertical stack of an insulating layer on both sides of a conducting control layer. The control element 5 is asymmetrically positioned.

Figure 6:
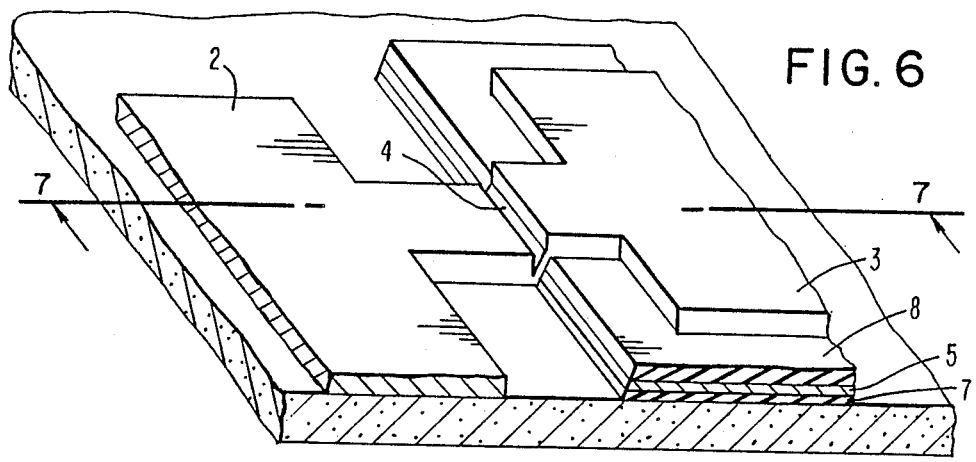
FIG. 6 is a perspective view of another embodiment of the invention.
Figure 7:
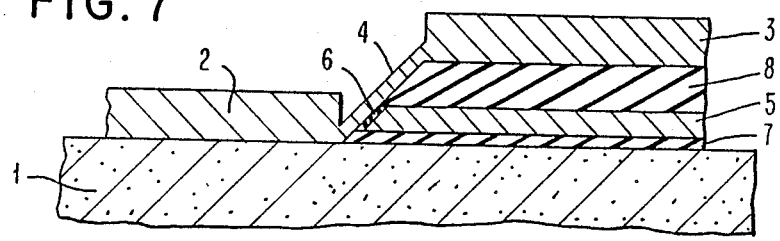
FIG. 7 is a side view of FIG. 6 taken along the line 7—7 of FIG. 6.

The structure is shown from a side view in FIG. 7 taken along the line 7—7 of FIG. 6. On the substrate 1 the regions of broad cross-sectional areas 2 and 3 are joined by the microbridge link 4 which is on the beveled edge of stack of horizontal layers 7, 5 and 8 where the layer 5 is the control electrode and is asymmetrically positioned with respect to the length of element 4 by the fact that the insulating layer 7 is thinner than that of the insulating layer 8 and the control electrode insulating layer 6 separates elements 5 and 4.

In operation, referring to FIG. 7, quasiparticles are introduced from the control electrode 5 through the insulator 6 into the superconducting microbridge link 4. The quasiparticle current produces a condition in which the superconductivity in the microbridge link 4 at the point of injection is disturbed and a localized hot spot occurs in the microbridge link 4 at the point of injection. The hot spot once nucleated propagates and drives the entire microbridge link 4 resistive. The special property requirements in the microbridge link that there be a high critical supercurrent density and high normal state resistivity assist in the propagation. The requirement that there be a high normal resistivity also provides the large voltage gain. The high resistivity provides the ability to drive other devices and allows the length of the link 4 to be small so the hot spot propagation is very rapid.

In comparing the embodiments of FIGS. 4, 5, 6, and 7 with the prior art devices major advantages of the invention over the prior art are that (1) both lateral and thickness control are used to establish structurally the asymmetric location of the hot spot nucleation needed for isolation and (2) the large supercurrent density and the high resistivity provide for small devices and high speed response and a large voltage output, yet high current gain is retained.

In comparing the invention with previous switches, the structure of the invention has no shared electrode as in U.S. Pat. No. 4,334,158. Further, the asymmetry of control electrode placement which is provided and facilitated by variable lateral and thickness geometries provides advantages not available in other microbridge and weak link structures heretofore in the art.

Figure 8:
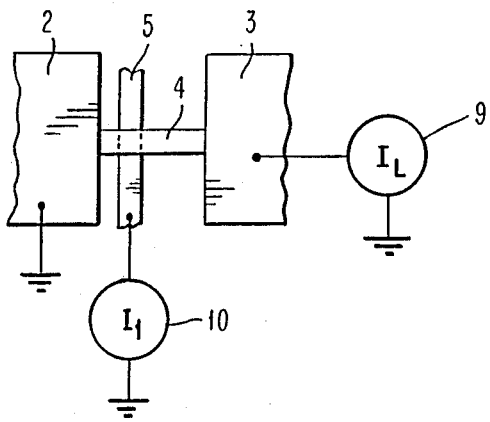
FIG. 8 is a schematic illustration of circuit connections to demonstrate the current performance of the invention.
Figure 9:
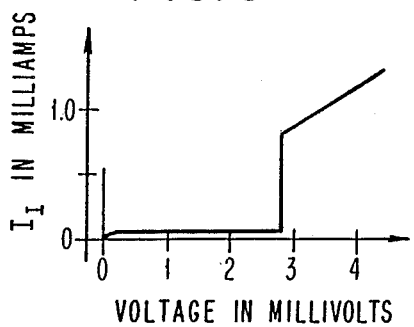
FIGS. 9, 10 and 11 are electrical operating characteristics of the invention.
Figure 10:
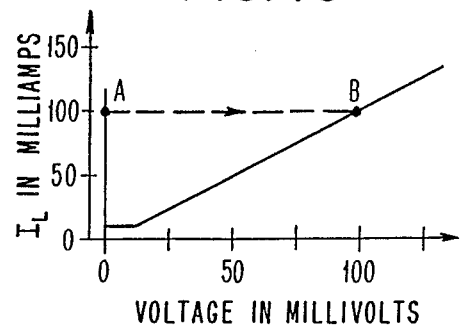
Figure 11:
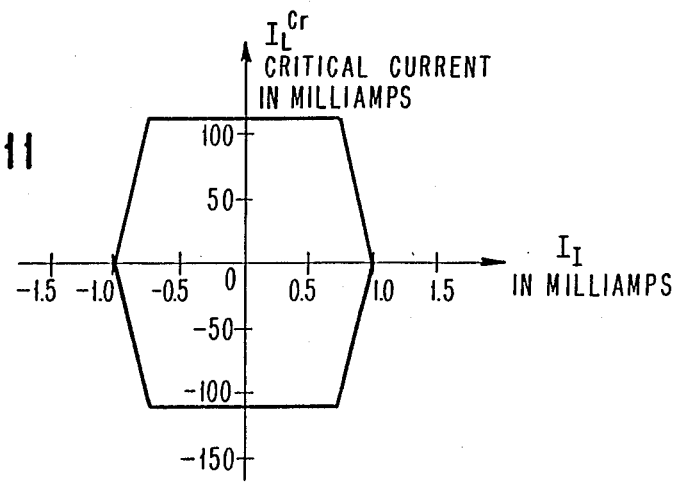

The circuit performance operation of the device of the invention is illustrated in the combination of FIGS. 8 through 11. In FIG. 8 a schematic of the invention with load and biasing current sources is illustrated. In FIGS. 9, 10 and 11 the operating characteristics are graphically shown.

Referring to FIG. 8 wherein like reference numerals with respect to FIGS. 4–7 are employed, in the output circuit, element 2 is connected to ground and element 3 is connected to ground through a current generator element 9, labelled $I_L$, which provides a current through the microbridge link 4. The current $I_L$ chosen to be close to but less than the deliberately selected high critical supercurrent of the microbridge link 4. Through control electrode 5 into the microbridge link 4, an injection current generator element 10 provides a quasiparticle injection current labelled $I_i$. As the quasiparticle injection current $I_i$ is increased, the critical supercurrent value is reduced. The microbridge link 4, in accordance with the invention, has been constructed to have much stronger sensitivity to quasiparticle injection current $I_i$ than to supercurrent $I_L$, so that a small value of $I_i$ can make big changes in the microbridge link 4 critical supercurrent. When the current $I_i$ reaches the critical quasiparticle injection current, the microbridge link spot under the control electrode 5 becomes resistive. The additional dissipation caused by the Joule heating due to the current $I_L$ being in the resistive region at this location will cause the resistive region to spread, ultimately propagating until the entire microbridge link 4 is in the resistive state. In doing so, a substantial voltage will appear across the microbridge link 4 and by virtue of the asymmetric positioning of the control electrode and the vertical geometry for that positioning, the large voltage that develops in the output has only a small effect on the input voltage. The size of this generally undesirable effect on the input can be made arbitrarily small by increasing the device asymmetry.

The injector characteristics are illustrated graphically in connection with FIG. 9. The microbridge link output performance is further graphically illustrated in FIG. 10 wherein an operating point shown as A prior to the quasiparticle injection will shift abruptly to point B, generating a substantial voltage when the microbridge link 4 becomes resistive.

The switching principle of the invention has latching properties. When $I_i$ quasiparticle injection current applied through control electrode 5 into the microbridge link 4 is switched off, the dissipation in the microbridge link 4 is sufficient to keep the microbridge link 4 in the resistive state. The microbridge link 4 current $I_L$ must be turned off in order for the microbridge link 4 to return to the normal state. The device thus latches in the resistive state. Further, since superconducting devices are sensitive to temperature, the latching is also controllable by temperature. Because the critical current for quasiparticle injection is substantially less than the critical supercurrent of the microbridge link 4, there will be substantially more current that can be diverted out of the output path made up of elements 2, through microbridge link 4 to 3 into a resistive load than is required to initiate the switching. The device of the invention has substantial current gain. Supercurrents in excess of 100 milliamps can be switched for example with 1 milliampere of quasiparticle injection current.

Referring next to FIG. 11, a threshold curve is illustrated for the switching performance of the microbridge link 4 from the superconducting state to the normal state illustrating the high current gain. The Josephson or quantum mechanical tunneling insulator 6 is fabricated to have a voltage sensitive barrier such that a voltage is required that is just beyond the current step at about 2.7 millivolts in FIG. 9, for example, while enough quasiparticle current is being supplied to drive the region of the microbridge link adjacent to it into the resistive state by the quasiparticle injection.

Under these circumstances, the control electrode 5 injection voltage would be approximately 3–5 millivolts whereas the output voltage, which is proportional to the normal state resistivity and the length of the microbridge link, can be made arbitrarily large. Outputs as large as 100 millivolts are achieved. The voltage gain a well as the current gain can therefore be large. In practice, only a modest voltage gain would be needed in most situations and shorter, high resistivity devices may be designed so that the response time would be faster.

The location of control element 5 asymmetrically closer to the region 2 than the region 3 is so that only a small voltage drop appears between the grounded electrode 2 in FIG. 8 and the base electrode 5 of the injector junction made up of layers 4, 6 and 5. It is desirable to keep such a voltage drop as small as possible in order that the quasiparticle current injected into the microbridge link 4 is as little disturbed as possible by the large voltage that develops across the link. In this manner, good isolation of the output from the input will be achieved.

The turn-on and turn-off speeds of the propagating hot spot in the microbridge 4 are strong functions of device size of the microbridge link 4, with smaller sizes having much faster responses. Devices of the basic geometry shown in FIGS. 4–7, but with minimum lateral feature sizes of a few tenths of a micron exhibit response times of the order of tens of picoseconds. Such switching speeds make the device suitable for high performance logic and memory circuit applications with the significant advantages of higher gain and smaller size.

Non-latching performance is also possible. In small well-cooled microbridge links the cooling might be sufficient so that when the injection is removed, the link will instead return to a superconducting state and the device will thus not latch up.

In general, the fabrication of planar devices as the embodiment of the invention in FIGS. 4 and 5 with lateral feature sizes and alignment tolerances of the order of 0.1 micron are feasible with advanced lithography. In the embodiment of the invention of FIGS. 6 and 7, the submicron feature sizes and submicron alignments are achieved without any demanding submicron lithography. In these structures, the injection insulator 6 is an edge junction formed on the edge of the control electrode 5 sandwiched in an insulator control element insulator trilayer 7, 5 and 8. The microbridge link 4 covers the trilayer edge, with the larger electrode portions 2 and 3 of the variable thickness bridge being above and below the edge on which the link is located. The structure of FIGS. 6 and 7 may be fabricated by a sequence of steps such that the injection insulator 6 at the edge of the control member 5 is self-aligned along the microbridge link 4 on the 7, 8, 5 film edge and the broad area banks 2 and 3 are self-aligned above and below the link on the edge. The spacing in this structure is determined by film thicknesses which can be very well controlled.

Figure 12A:
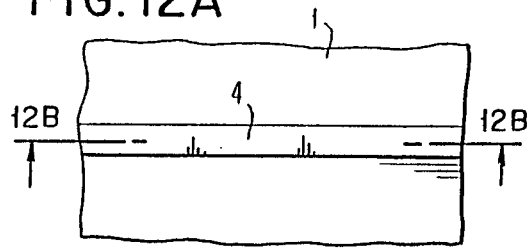
FIGS. 12A through 12H are plan and side views of the steps involved in the manufacture of the embodiment of the invention illustrated in FIG. 4.
Figure 12B:
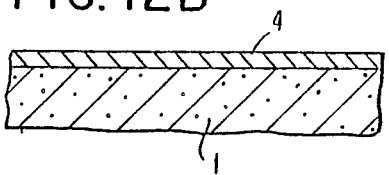

Referring to FIGS. 12A-12H, an illustration is provided of the steps involved in the fabrication of the device of FIGS. 4 and 5. In FIG. 12A in a first step, the microbridge link 4 is deposited through a resist pattern for a particular width and thickness, on a suitable, substrate 1. A side view along the line 12B-12B is shown in FIG. 12B. For an example, the substrate 1 may be Al$_2$O$_3$ and the microbridge link material 4 may be NbN, which has the special properties of high critical supercurrent threshold density and high normal resistivity when deposited by the technique of reactive sputtering.

Figure 12C:
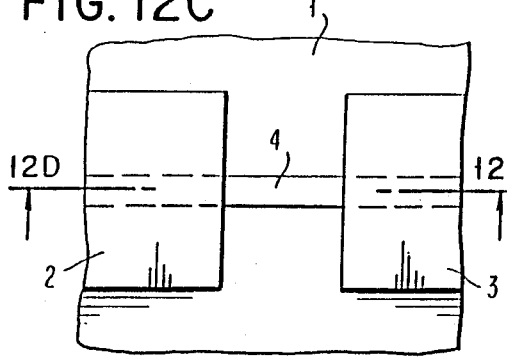
Figure 12D:
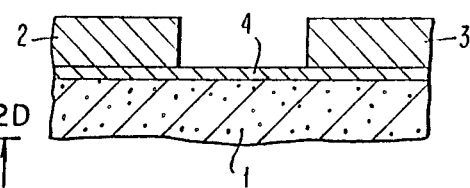

Referring next to FIG. 12C, the broad area regions 2 and 3 are simultaneously deposited on the ends of the microbridge link 4 using standard techniques of photoresist, patterning, depositing, and etching or lift-off. A side view of FIG. 12C, taken along line 12D-12D, is shown in FIG. 12D.

Figure 12E:
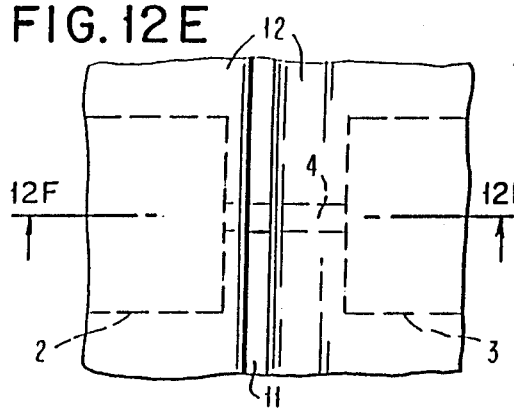
Figure 12F:
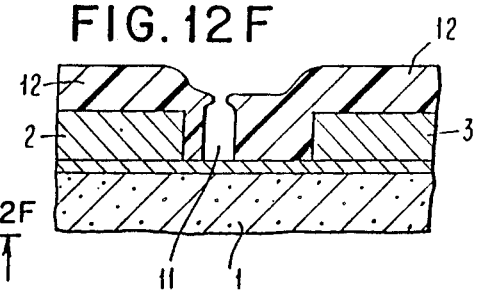

Referring next to FIGS. 12E and 12F (a side view taken along the line 12F—12F in FIG. 12E), the location for positioning of the control electrode 5 and insulator 6 is provided. In FIG. 12E the substrate and conductors fabricated thus far are coated with photoresist and a lift-off stencil is patterned with an opening 11 for the control electrode 5 and insulator 6. The lift-off resist shown as 12, has a narrow opening 11 for deposition of the insulator 6 and control electrode 5.

Figure 12G:
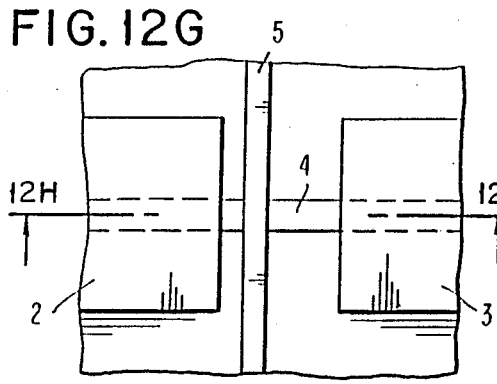
Figure 12H:
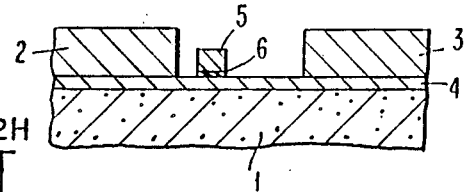

Referring next to FIGS. 12G and 12H (a side view taken along the line 12H—12H in FIG. 12G) top and side views are provided of the completed device of FIGS. 4 and 5 including the control electrode 5. The insulator 6 is formed in the opening 11 of the photoresist 12 in FIG. 12F by oxidizing the exposed microbridge link region 11 before deposition of the control electrode 5. The coated stencil 12 is removed, leaving the completed structure.

It will be apparent to one skilled in the art that each of the steps employed are well known and individually all involve commonly practiced procedures. It would further be apparent to one skilled in the art in the light of the principles set forth that alternative processes may be substituted for the individual steps.

Referring next to FIGS. 13A-13D, a fabrication approach is provided for the structure of FIGS. 6 and 7. In the structure of FIG. 6, features of size of the order of 0.1 micrometer are self-aligned and readily achieved using conventional optical lithography.

Figure 13A:
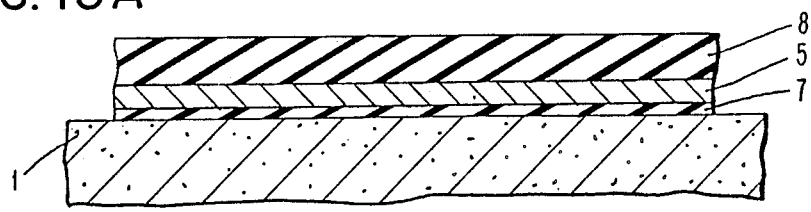
FIGS. 13A through 13D are illustrations of the partial product formed at steps of manufacture of the embodiment of the invention in FIG. 6.

Referring to FIG. 13A, a blanket depositing series of steps is employed for the trilayer 7, 5, 8 insulator-superconductor-insulator sandwich on a suitable substrate 1. This is accomplished by the deposition, of a film of for example, Nb, anodizing it to completion, depositing a second Nb film on top of the anodized layer, and partially anodizing this top Nb film, leaving a Nb$_2$O$_5$—Nb—Nb$_2$O$_5$ trilayer with different oxide thicknesss produced by the anodizations.

Figure 13B:
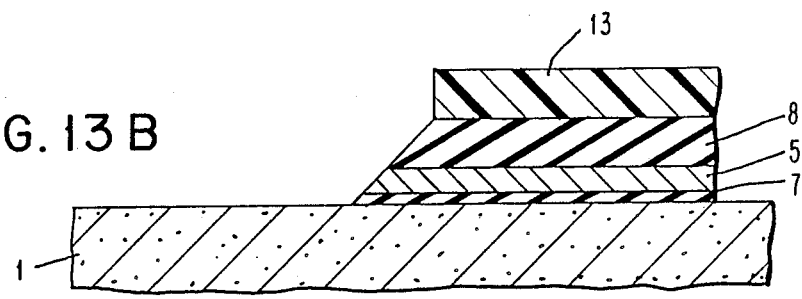

Referring to FIG. 13B, the trilayer assembly is coated with photoresist 13, the photoresist is patterned and plasma etched into the underlying trilayer film. A well known CF$_4$—O$_2$ plasma etch process will produce the 45 degree angular edge face 13 in the trilayer. Alternatively, a sputtered trilayer could be similarly patterned using an ion milling process to produce the angular face.

Figure 13C:
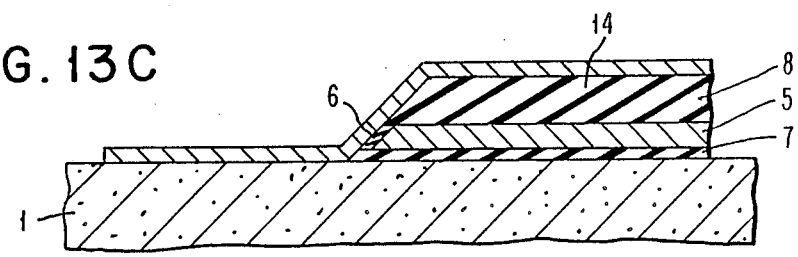

Referring to FIG. 13C, the etching stencil is then stripped and the trilayer is again coated with photoresist and a lift-off stencil for the link material is formed. The exposed control element edge 5 in the trilayer is oxidized to form the insulating barrier 6, for example Nb$_2$O$_5$ on an Nb control element 5 edge. The microbridge link 4 material 14, for example NbN, is then deposited. The coated stencil is then removed leaving the structure illustrated in FIG. 13C.

Figure 13D:
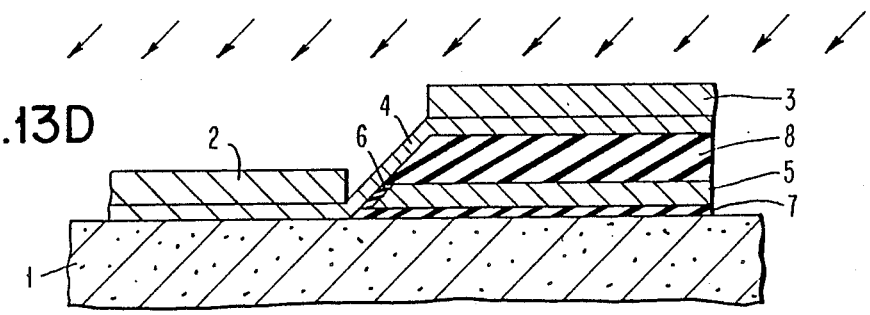

Referring next to FIG. 13D, the broad area regions corresponding to elements 2 and 3 of, for example, Nb are then deposited by a shadow evaporation shown by an angle which is slightly greater than the angular edge face of the trilayer so that the broad area regions 2 and 3 are built up more rapidly on the horizontal than over the diagonal edge face where the link would go. This produces broad area regions or banks 2 and 3 that are self-aligned to the microbridge link 4 and with the insulator 6. A resist stencil and an etching process can be used to pattern this layer where it need not be critically aligned.

BEST MODES FOR CARRYING OUT THE INVENTION

Referring to FIGS. 4 and 5, the substrate 1 would be Al$_2$O$_3$, the microbridge link 4 would be for example Nb and the broad area regions 2 and 3 would be Nb. The length of the microbridge 4 would be 2-4 microns wide, 1500 Angstroms thick and 10-40 microns in length. The insulator 6 would be of Nb oxide at a thickness of the order of 15 Angstroms. This thickness would provide a tunneling threshold of 0.1 volt. The Nb material has the properties of high critical current density for superconductivity and high normal resistivity.

The performance of the device of FIG. 4 would be the gain bandwidth product governed by the speed of propagation of the hot spots. For this, the solution of the heat equation, Equation 1, is required.

$$C\frac{dT}{dt} - K_n\frac{d^2T}{dx^2} + \frac{a}{d}(T - T_B) = \left(\frac{I}{Wd}\right)^2 \rho\theta(x_o(t) - x) \quad \text{Equation 1}$$

where

C = specific heat
$K_n$ = thermal conductivity in superconductor and normal metal
$\alpha$ = heat transfer coefficient out of film laterally
d = film thickness
$T_b$ = bath temperature
I = current
$\rho$ = resistivity
W = film width
$x_o(t)$ = location of spot where $T = T_c$ (separates dissipative region from superconducting region)

Assuming a solution of the form $T(x,t) = T(x - vt) = T(z)$, where v is the velocity of hot spot propagation, and applying the and matching conditions in Equations 2 to 6:

$$T(-\infty) = T_b + \frac{d}{\alpha}\left(\frac{I}{Wd}\right)^2 \rho \equiv T_h \quad \text{Eq. 2}$$

$$T(\infty) = T_b \quad \text{Eq. 3}$$

T continuous across the region  Eq. 4 where dissipation starts ($x - vt = 0$)

$$K\frac{dT}{dz}\bigg|_{z=0^-} = K\frac{dt}{dz}\bigg|_{z=0^+} \quad \text{Eq. 5}$$

$$T(z = 0) = T_c, \quad \text{Eq. 6}$$

the result is $$v = \frac{1}{C}\sqrt{\frac{\alpha K_n}{d}} \; \frac{T_h + T_b - 2T_c}{\sqrt{(T_c - T_b)(T_h - T_c)}} \quad \text{Eq. 7}$$

so that the rate of voltage change is $$\frac{dV}{dt} = I\frac{\rho}{Wd}v \quad \text{Eq. 8}$$

and the "rise time" $t_{rise}$ for a microbridge link of length L and output voltage $\Delta V = IL\rho/Wd$ is given by $$t_{rise} = \frac{\Delta V}{dV/dt} = LC\sqrt{\frac{d}{\alpha K_n}} \; \frac{T_h - T_b - 2T_c}{\sqrt{(T_c - T_b)(T_h - T_c)}} \quad \text{Eq. 9}$$

The turn off time $t_{fall}$, can be as follows in Equation 10.

$$t_{fall} = \frac{Cd(T_h - T_c)}{\alpha(T_h - T_b)}. \quad \text{Eq. 10}$$

In a preferred structure of Nb with $T_c = 9.2°$ K., $C = 7.1 \times 10^{-3}$ J/cm$^3$-K with an assumed microbridge 4 link critical current density of $10^7$ A/cm$^2$, $\rho = 100$ $\mu\Omega$-cm, $\alpha = 30$ W/cm$^2$-K and with the microbridge link dimensions of thickness = 50Å, width = 0.5$\mu$, and length = 1.5$\mu$. Then $t_{rise}$ would be 160 picoseconds and $t_{fall}$ would be 115 picoseconds.

This structure can be made with much smaller lateral dimensions than the example given with respect to FIGS. 4 and 5, and in turn correspondingly much higher device speeds.

Referring next to FIGS. 6 and 7, which is preferred, the microbridge link would be chosen of NbN, which is a material having a large supercurrent in the superconducting state and a highly resistance in the normal state. The trilayer combination of 7, 5 and 8 would be 0.05 micron thick Nb$_2$O$_5$, 0.05 micron thick Nb, and 0.1 micron thick Nb$_2$O$_5$, which can be plasma etched. The insulator 6 would be of Nb$_2$O$_5$ about 15 Å thick.

In performance, consider the microbridge link to be a 50 Angstrom or greater thick NbN film, 2 microns wide, 0.20 microns long, having a critical supercurrent density of $10^7$ A/cm$^2$ and a resistivity of 200 microohm-cm. Under these circumstances, the microbridge link would then have a resistance of 20 ohms. Such an output resistance would drive a 5-10 ohm superconducting transmission line. The critical supercurrent for such dimensions would be 4 mA. When the microbridge link switches into the normal state, most of the current is transferred into the load as output current. For example, 3.2 mA would be transferred into a 5 ohm transmission line load. The output voltage across the 5 ohm load of the transmission line would then be 16 mV.

For an device, the input quasiparticle current sufficient to drive the microbridge link 4 into the normal state is needed. For quasiparticle injection to drive the microbridge link 4 into the normal state, it is necessary for a normalized quasiparticle density, $N_{qp}/4N(0)\Delta_o$ of 0.4 to be built up. (N(0) is the single spin density of states at the Fermi level; $\Delta_o$ is the zero temperature superconducting energy gap.) The quasiparticle density that is built up is determined by a balance of the injection rate by tunneling, $I_{gp}$, and the removal time, $\tau^*$, according to the expression in Equation 11.

$$N_{qp} = I_{qp}\tau^*/eV \quad \text{Eq. (11)}$$

where V is the bridge volume. Thus we get $$I_{qp} = 1.6eVN(0)\Delta_o/\tau^* \quad \text{Eq. (12)}$$

for the injection quasiparticle current necessary to drive the microbridge link 4 normal. The quasiparticle removal from the microbridge link 4 is by recombination or by diffusion into the large area or bank regions 2 and 3. The intrinsic recombination time for NbN has never been measured or calculated, but is expected to be less than 20 ps. Phonon trapping would make the time longer. In the variable thickness bridge geometry, however, diffusion out to the bank regions would be expected to be the dominant quasiparticle removal mechanism. This time can be estimated as $$\tau_D = \frac{L^2}{\frac{1}{3}v_Fl} \quad \text{Eq. (13)}$$

where L is half of the microbridge link 4 length, $v_F$ is the Fermi velocity, and l is the mean free path for elastic scattering. Assuming $2 \times 10^8$ cm/s for $v_F$ and 10 A for the mean free path (a worst case estimate), we get $\tau^* = 15$ ps. Using this to solve for $I_{gp}$ in (2) we get $I_{gp} = 320$ $\mu$A. That gives a current gain of 10. This quasiparticle input current $I_i$ would be input at the sum gap voltage, ~3 mV, so that a voltage gain of 5 is achieved.

These gains and speeds are quite respectable, and the device could serve as a general purpose logic or memory device. The device is noninverting and is expected to be latching, like the Josephson device, but it has high gain and a small size.

It will be apparent to one skilled in the art in the light of the principles set forth that alternative dimensions, materials and processes may be substituted and the performance varied.

In summary, what has been disclosed is a device where a quasiparticle injection current is introduced at an asymmetric location into a microbridge link the link having a high critical current density for superconductivity and a high normal resistivity. The current is injected at a position that is fixed by the geometry of the structure so that reliable and reproducible high gain bandwidths are achieved.

Having thus described our invention, what we claim as new and desire to secure by Letters Patent is:

1. In a superconductor switching device of the type where a signal impressed on a superconducting reduced cross-sectional area member positioned between first and second larger cross-sectional area members operates to terminate the superconducting condition in said reduced cross-sectional area member,
   the improvement for voltage gain, input to output decoupling and speed while retaining current gain, comprising in combination:
   said reduced cross-sectional area member having the properties of high superconductivity critical current density and high normal resistivity,
   means adjacent only to said reduced cross-sectional area member for injecting a quasiparticle control signal only into a portion of said reduced cross-sectional area member at a location closer to said first larger cross-sectional area member than to said second larger cross-sectional member, and
   output current means connected to said second larger cross-sectional area member.

2. The device of claim 1 wherein said reduced cross-sectional area member is on the same substrate surface that supports said first and second larger area members and said quasiparticle injection means is a conductor positioned proximate to said first larger area member and separated from said reduced cross-sectional area member by a tunnel barrier said conductor laterally extending over only said reduced cross-sectional area member.

3. The device of claim 2 wherein said reduced cross-sectional area includes a difference in thickness.

4. The device of claim 1 wherein said quasiparticle injecting means is a central conductor exposed at a beveled surface thereof, there being an insulating layer of a first thickness on a first side of said conductor and an insulating layer of a larger thickness on the second side of said conductor, said conductor being oxidized at the exposure in said beveled surface, and said reduced cross-sectional area member being positioned on said beveled surface.

5. The device of claim 4 wherein said reduced cross-sectional area includes a difference in thickness.

6. The device of claim 2 wherein said reduced cross-sectional area member is NbN.

7. The device of claim 4 wherein said reduced cross-sectional area member is NbN.

8. The device of claim 6 wherein said NbN reduced cross-sectional area member is greater than or equal to 50 Å thick.

9. The device of claim 7 wherein said NbN reduced cross-sectional area member is greater than or equal to 50 Å thick.

10. A superconductor switching device of the type wherein a signal impressed on a reduced cross-sectional area member carrying a supercurrent positioned between first and second larger cross-sectional area members operates to terminates the superconducting condition in said reduced cross-sectional area member, the improvement comprising in combination
    means localized only in a region of said reduced cross-sectional area member for nucleating a spot with normal resistance in an asymmetric location in said reduced cross-sectional area member, said spot being a small region of said reduced cross-sectional member, and
    means for propagating said spot with normal resistance substantially throughout said reduced said reduced cross-sectional area member to make said reduced cross-sectional area member substantially normal and of higher resistance.

11. The device of claim 10 wherein
    said means for nucleating a spot with normal resistance is the combination of a high superconducting current density in said reduced cross-sectional area member and quasiparticle current injection, and
    said means for propagating said spot is the combination of a high normal resistivity property of said reduced cross-sectional area member and a high current in said reduced cross-sectional area member.

12. The device of claim 11 wherein said reduced cross-sectional area member is on the same substrate surface that supports said first and second larger area members and said quasiparticle injection means is a conductor positioned proximate to said first larger area member and separated from said reduced cross-sectional area member by a tunnel barrier.

13. The device of claim 12 wherein said reduced cross-sectional area member is NbN.

14. The device of claim 11, wherein said quasiparticle injecting means is a central conductor exposed at a beveled surface thereof, there being an insulating layer of a first thickness on a first side of said conductor and an insulating layer of a larger thickness on the second side of said conductor said conductor having a tunnel barrier, and said reduced cross-sectional area member being positioned on said beveled surface.

15. The device of claim 14 wherein said reduced cross-sectional area member is NbN.

16. A signal translating superconductor device comprising in combination
    an input to output superconductor current member, said member having a road cross-sectional area at each extremity thereof joined by a reduced cross-sectional area switching control region, and
    a control electrode in tunneling relationship only with a small portion of said switching control region, said small portion being closer to one broad cross-sectional area member than tho the other broad cross-sectional area member.

17. The device of claim 16 wherein said reduced superconductor current member is positioned with the broad cross-sectional area members and the reduced cross-sectional area member on a single surface with the reduced-sectional area member having a smaller thickness and
    said control electrode being positioned on an insulating layer on said reduced cross-sectional area member nearer to one broad cross-sectional area member than to the other cross-sectional area member, said control electrode laterally extending only over a portion of said reduced cross-sectional area member.

18. The device of claim 16 wherein said control electrode is a central conductor exposed at a beveled surface thereof, there being an insulating layer of a first thickness on a first side of said conductor and an insulating layer of a larger thickness on the second side of said conductor, said conductor being covered by a tunnel barrier at the exposure in said beveled surface, and said reduced cross-sectional area member being positioned on said beveled surface.

19. A superconducting switching device comprising, in combination, first and second superconductive regions, a bridge connecting said first and second superconducting region, said bridge being comprised of a superconducting material exhibiting a high supercurrent density and a high resistance when in a nonsuperconducting resistive state, said bridge being capable of being switched to said nonsuperconducting resistive state, current means for providing an electrical current through said bridge, means for converting only a localized region of said bridge to said nonsuperconducting resistive state, said localized region being located closer to said first superconductive region than to said second superconductive region, means for propagating said nonsuperconducting resistive state from said localized region along said bridge to make a substantial length of said bridge resistive, and load means connected to said second superconductive region, said electrical current in said bridge flowing through said load means when said bridge becomes resistive along a substantial portion of its length.

20. The switching device of claim 19, where said means for converting includes injection means for injecting quasiparticles into only said localized region of said bridge.

* * * * *